United States Patent
Chen et al.

(10) Patent No.: US 11,600,517 B2
(45) Date of Patent: Mar. 7, 2023

(54) SCREWLESS SEMICONDUCTOR PROCESSING CHAMBERS

(71) Applicant: Taiwan Semiconductor Manufacturing Co., Ltd., Hsinchu (TW)

(72) Inventors: Bo-Ru Chen, Hsin-Chu (TW); Yan-Hong Liu, Hsinchu County (TW); Che-Fu Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 548 days.

(21) Appl. No.: 16/541,450

(22) Filed: Aug. 15, 2019

(65) Prior Publication Data

US 2020/0075402 A1 Mar. 5, 2020

Related U.S. Application Data

(60) Provisional application No. 62/719,562, filed on Aug. 17, 2018.

(51) Int. Cl.
*H01L 21/687* (2006.01)
*H01L 21/683* (2006.01)
(Continued)

(52) U.S. Cl.
CPC .... *H01L 21/68785* (2013.01); *C23C 16/4586* (2013.01); *H01J 37/3244* (2013.01); *H01J 37/32715* (2013.01); *H01L 21/6833* (2013.01); *H01L 21/68721* (2013.01); *C23C 16/45565* (2013.01); *H01L 21/76856* (2013.01)

(58) Field of Classification Search
CPC ........... H01L 21/68785; H01L 21/6833; H01L 21/68721; H01L 21/76856; C23C 16/4586; C23C 16/45565; C23C 16/4585; H01J 37/3244; H01J 37/32715; H01J 37/32807
See application file for complete search history.

(56) References Cited

U.S. PATENT DOCUMENTS 2,283,974 A * 5/1942 Dillon .................... F16L 37/252
                                                          285/18
2,333,243 A * 11/1943 Glab ...................... F16L 37/113
                                                          285/33
(Continued)

FOREIGN PATENT DOCUMENTS

CN  101453822 A  6/2009
CN  102037790 A  4/2011
(Continued)

OTHER PUBLICATIONS

Dan Bollock. "Tips for Stronger Tenons." Fine Woodworking. Jan./Feb. 2017. pp. 60-63. (Year: 2017).*

*Primary Examiner* — Jeffrie R Lund
(74) *Attorney, Agent, or Firm* — Duane Morris LLP

(57) ABSTRACT

In an embodiment, a system includes: a gas distributor assembly configured to dispense gas into a chamber; and a chuck assembly configured to secure a wafer within the chamber, wherein at least one of the gas distributor assembly and the chuck assembly includes: a first portion comprising a convex protrusion, and a second portion comprising a concave opening, wherein the convex protrusion is configured to engage the concave opening.

20 Claims, 12 Drawing Sheets

(51) Int. Cl.
  *C23C 16/458* (2006.01)
  *H01J 37/32* (2006.01)
  *H01L 21/768* (2006.01)
  *C23C 16/455* (2006.01)

(56) References Cited

U.S. PATENT DOCUMENTS

| | | | | |
|---|---|---|---|---|
| 3,747,632 A | * | 7/1973 | Kok | F16L 59/153 |
| | | | | 137/375 |
| 4,512,368 A | * | 4/1985 | Kaminaka | B65G 53/528 |
| | | | | 137/561 A |
| 4,782,852 A | * | 11/1988 | Legris | F16L 37/252 |
| | | | | 137/269 |
| 4,878,695 A | * | 11/1989 | Whitham | F16L 37/252 |
| | | | | 285/39 |
| 5,145,276 A | * | 9/1992 | Demange | F16B 7/20 |
| | | | | 285/360 |
| 5,165,732 A | * | 11/1992 | Townsend | F16L 13/163 |
| | | | | 126/307 R |
| 5,269,894 A | * | 12/1993 | Kerschbaumer | H01J 37/3497 |
| | | | | 204/192.12 |
| 5,589,003 A | * | 12/1996 | Zhao | C23C 16/4585 |
| | | | | 118/728 |
| 5,597,459 A | * | 1/1997 | Altshuler | H01J 37/3408 |
| | | | | 204/192.12 |
| 5,680,013 A | * | 10/1997 | Dornfest | H01J 37/32495 |
| | | | | 315/111.21 |
| 6,050,216 A | * | 4/2000 | Szapucki | C23C 16/45565 |
| | | | | 118/723 E |
| 6,113,704 A | * | 9/2000 | Satoh | C23C 16/4586 |
| | | | | 118/724 |
| 6,170,432 B1 | * | 1/2001 | Szapucki | C23C 16/455 |
| | | | | 118/723 E |
| 6,237,528 B1 | * | 5/2001 | Szapucki | C23C 16/45565 |
| | | | | 118/723 E |
| D576,258 S | * | 9/2008 | Ribers | D23/262 |
| D754,304 S | * | 4/2016 | Morris | D23/260 |
| 9,522,338 B1 | * | 12/2016 | Park | A63G 31/007 |
| D829,869 S | * | 10/2018 | McClam | D23/260 |
| 2002/0139479 A1 | * | 10/2002 | Antolik | H01L 21/68721 |
| | | | | 156/345.47 |
| 2006/0011298 A1 | * | 1/2006 | Lim | C23C 16/45565 |
| | | | | 156/345.34 |
| 2006/0266852 A1 | * | 11/2006 | Choi | C23C 16/45565 |
| | | | | 239/548 |
| 2006/0283336 A1 | * | 12/2006 | Eveleigh | F16L 37/23 |
| | | | | 99/403 |
| 2007/0163716 A1 | | 7/2007 | Hsiao et al. | |
| 2007/0169704 A1 | * | 7/2007 | Hao | H01J 37/32623 |
| | | | | 118/733 |
| 2009/0145359 A1 | * | 6/2009 | Arita | H01J 37/3244 |
| | | | | 118/723 E |
| 2009/0214287 A1 | * | 8/2009 | Usui | F16L 37/36 |
| | | | | 403/42 |
| 2009/0322199 A1 | * | 12/2009 | Augustino | H01J 37/32605 |
| | | | | 313/243 |
| 2010/0008014 A1 | * | 1/2010 | Lu | H01L 21/6833 |
| | | | | 361/234 |
| 2011/0277229 A1 | * | 11/2011 | Connor | E03F 5/0407 |
| | | | | 4/293 |
| 2011/0291568 A1 | * | 12/2011 | Iizuka | H01J 37/3244 |
| | | | | 315/111.51 |
| 2011/0308732 A1 | * | 12/2011 | La Croix | H01J 37/32431 |
| | | | | 156/345.1 |
| 2011/0310525 A1 | | 12/2011 | Lu et al. | |
| 2012/0000605 A1 | * | 1/2012 | Kellogg | H01J 37/32623 |
| | | | | 156/345.1 |
| 2012/0003836 A1 | * | 1/2012 | Kellogg | H01L 21/68735 |
| | | | | 438/710 |
| 2012/0174521 A1 | * | 7/2012 | Schulte | E04F 15/02 |
| | | | | 52/588.1 |
| 2012/0175062 A1 | | 7/2012 | De La Llera et al. | |
| 2012/0309204 A1 | * | 12/2012 | Kang | H01J 37/3211 |
| | | | | 438/719 |
| 2013/0098554 A1 | * | 4/2013 | Chhatre | H01J 37/32119 |
| | | | | 156/345.27 |
| 2013/0284092 A1 | | 10/2013 | Wilson et al. | |
| 2014/0186990 A1 | * | 7/2014 | Kusuhara | C23C 16/345 |
| | | | | 438/72 |
| 2014/0203526 A1 | | 7/2014 | Banda et al. | |
| 2014/0235061 A1 | * | 8/2014 | Stumpf | B23B 1/00 |
| | | | | 438/710 |
| 2015/0211728 A1 | * | 7/2015 | Zhadanov | B05B 1/185 |
| | | | | 362/96 |
| 2015/0380281 A1 | * | 12/2015 | Sriraman | H01L 21/32136 |
| | | | | 438/710 |
| 2016/0064201 A1 | * | 3/2016 | Krassnitzer | H01J 37/3438 |
| | | | | 204/298.09 |
| 2016/0071706 A1 | * | 3/2016 | Kerschbaumer | C23C 14/3407 |
| | | | | 204/298.09 |
| 2016/0245250 A1 | * | 8/2016 | Noguchi | F02M 61/168 |
| 2016/0314981 A1 | | 10/2016 | Yoon | H01L 21/32139 |
| 2017/0363658 A1 | * | 12/2017 | Hsu | G01R 31/2889 |
| 2017/0365444 A1 | * | 12/2017 | Kim | H01J 37/3244 |
| 2018/0122680 A1 | * | 5/2018 | Yang | H01J 37/32715 |
| 2020/0075402 A1 | * | 3/2020 | Chen | C23C 16/4586 |

FOREIGN PATENT DOCUMENTS

| | | | |
|---|---|---|---|
| CN | 104821269 A | | 8/2015 |
| JP | 2011003730 A | * | 1/2011 |
| KR | 20160015510 A | * | 2/2016 |

* cited by examiner

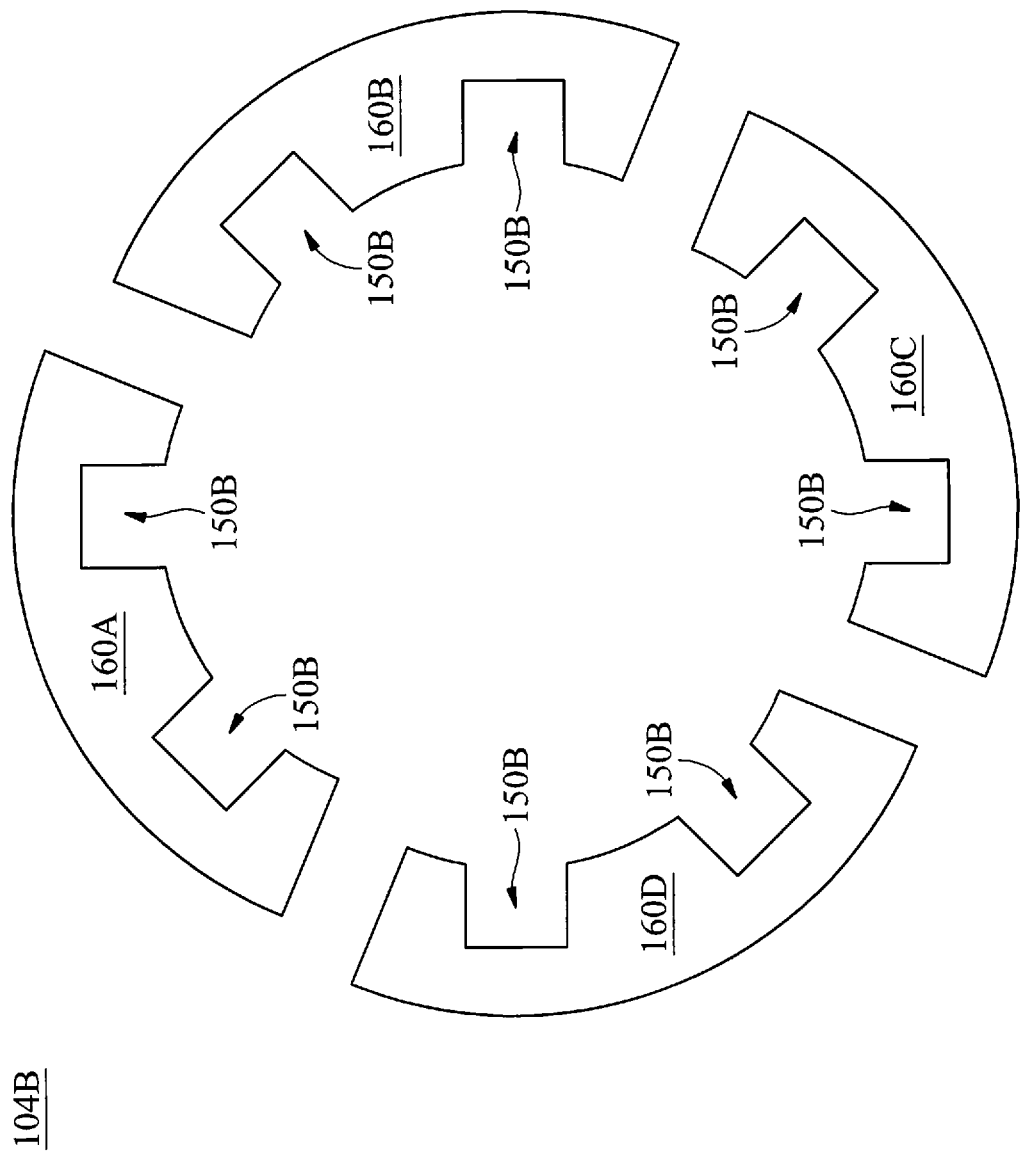

SCREWLESS SEMICONDUCTOR PROCESSING CHAMBERS

CROSS-REFERENCE TO RELATED APPLICATION

The present application claims priority to U.S. Provisional Patent Application No. 62/719,562, filed on Aug. 17, 2018, which is incorporated by reference herein in its entirety.

BACKGROUND

With advances of electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed requirements, dimensions of semiconductor integrated circuits have been reduced and various materials and techniques have been proposed to achieve these requirements and overcome obstacles during manufacturing. Controlling the conditions of processing wafers within chambers is an important part of semiconductor fabrication technology.

Chamber components are typically assembled using screws. However, the chamber components assembled using screws may incur damage during locking and loosening of the screws. Also, the screws themselves may become damaged due to use and may corrode over time. Therefore, conventional techniques for chamber component assembly are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 3B is a plan view illustration of the second gas distributor portion in a disassembled form, in accordance with certain embodiments.

DETAILED DESCRIPTION OF EXEMPLARY EMBODIMENTS

Figure 1:
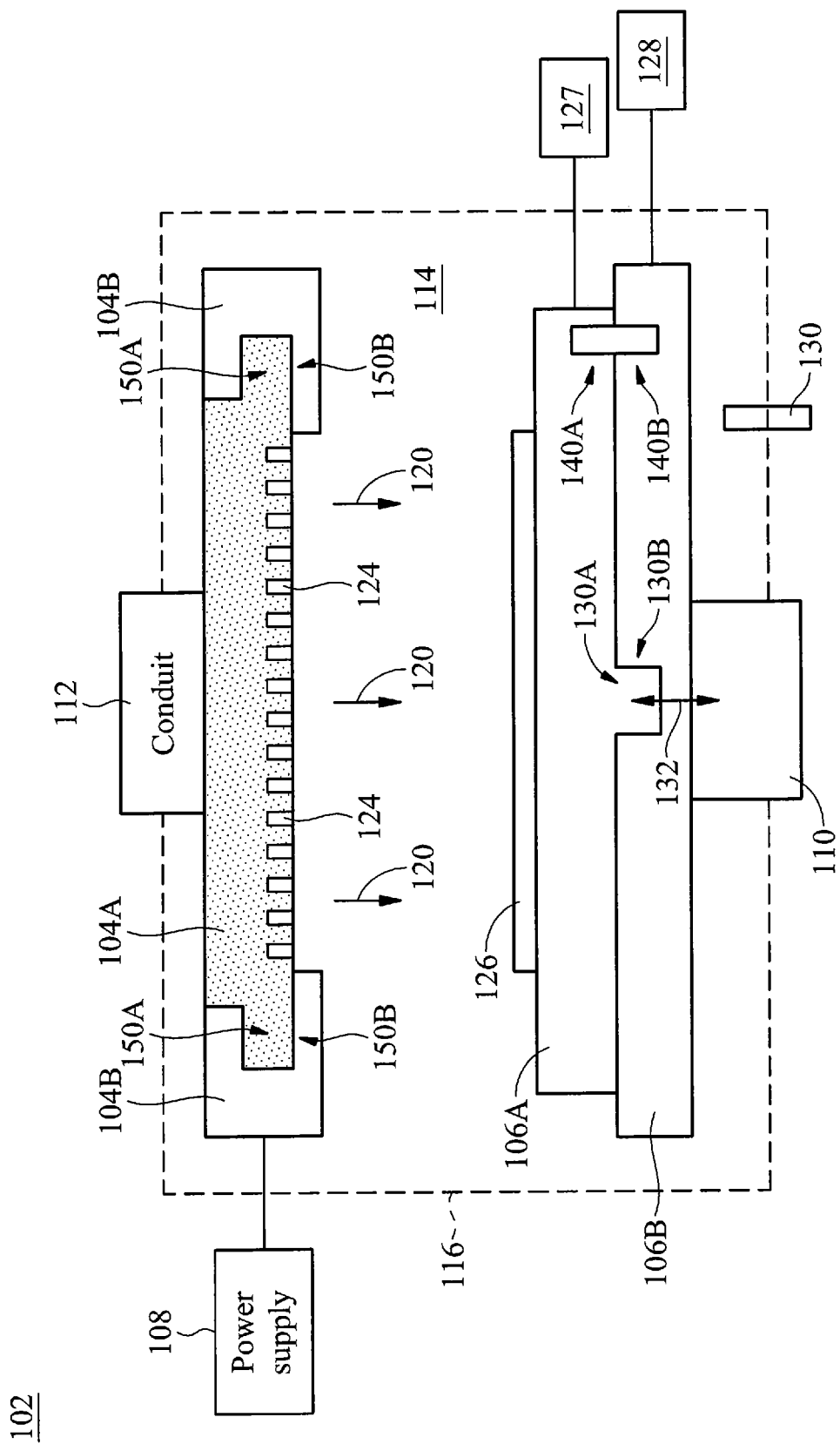
FIG. 1 is a side view illustration of a screwless semiconductor processing chamber with a screwless gas distributor assembly and a screwless chuck assembly, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to screwless semiconductor chambers. A screwless semiconductor chamber is a semiconductor chamber with separate parts that are assembled together without the use of screws or nails. Rather, the various parts are capable of assembly together via various contours and features on the parts themselves. In certain embodiments, the various parts may assemble together utilizing the various contours and features on the parts with the aid of gravity and/or specific pieces that provide adherence in a non-rigid manner (e.g., without the use of screws or nails). For example, parts of the semiconductor chamber may be assembled together utilizing, for example, a mortise joint, a tenon joint, an inner spiral, location pinning, snaps, and/or building blocks.

In various embodiments, certain parts of a screwless semiconductor chamber may be screwless, or assembled without screws or nails, while other parts of the screwless semiconductor chamber may utilize screws for assembly. For example, a screwless gas distributor assembly and/or screwless chuck assembly (e.g., an electrostatic chuck) may be assembled in a screwless manner. Such a screwless gas distributor assembly may include joints that interlock, such as with a combination of a mortise hole and a tenon tongue. As another example, a screwless chuck assembly may be assembled as an upper site (e.g., a first portion) to a lower site (e.g., a second portion) with an inner spiral protruding out of the upper site into the lower site and a location pin to control angular movement between the upper site and the lower site.

In certain embodiments, a chamber for semiconductor processing may include a gas distributor assembly configured to dispense gas into the chamber and a chuck assembly configured to secure a wafer within the chamber. Either, or both, of the gas distributor assembly and the chuck assembly may be formed of a first portion comprising a convex protrusion, and a second portion comprising a concave opening. This convex protrusion may be configured to enter (e.g., configured to engage) the concave opening to secure the first and second portions together. Stated another way, no screws or nails are utilized to secure the first and second portions together.

In various embodiments where the first and second portions are part of a gas distributor assembly, this convex portion may be a tenon tongue and the concave opening a mortise hole. For example, the second portion may form a ring (also referred to as a second portion gas distributor ring) around the first portion (also referred to as a first portion gas distributor shower head). Then, various tenon tongues, or convex protrusions, extending radially from the first portion may be configured to interface with and enter various mortise holes, or concave holes, of the second portion disposed radially around the first portion. In particular embodiments, the second portion may be formed of multiple pieces that are welded or otherwise adhered together without the use of nails or screws. For example, each piece of the second portion pieces may be injection molded (e.g., formed or constructed with an injection mold) with respective mortise holes, put together with the first portion, and then welded together to assemble the first and second portions of the gas distributor assembly. In specific embodiments, the tenon tongue (e.g., convex protrusion) within the mortise hole (e.g., concave opening) may be flush with (e.g., in contact with an entirety of) a surface of the mortise hole (e.g., concave opening).

In certain embodiments, the first and second portions may be part of a chuck assembly. As part of the chuck assembly, the convex portion may protrude from a center of the first portion and the concave portion may be located at a center of the second portion. Also, the first portion may include a first location pin concavity and the second portion comprises a second location pin concavity. A location pin may be configured to be disposed within the first location pin concavity and the second location pin concavity to secure the first portion to the second portion (e.g., to stop the portions from rotating relative to the other).

FIG. 1 is a side view illustration of a screwless semiconductor processing chamber 102 with a screwless gas distributor assembly 104A, 104B and a screwless chuck assembly 106A, 106B, in accordance with some embodiments. The screwless semiconductor processing chamber 102 may also include a power supply 108, a supporter 110, and a conduit 112 among other components illustrated in FIG. 1 that will be discussed further below. The screwless gas distributor assembly 104A, 104B, and screwless chuck assembly 106A, 106B, may be within an enclosure 114 substantially surrounded by walls 116 of the screwless semiconductor processing chamber 102.

The supporter 110 is connected to, and supports, the screwless chuck assembly 106A, 106B. The screwless gas distributor assembly 104A, 104B is disposed over the screwless chuck assembly 106A, 106B. Stated another way, the screwless chuck assembly 106A, 106B is underneath or under the screwless gas distributor assembly 104A, 104B. The conduit 112 is connected to the screwless gas distributor assembly 104A, 104B and provides a gas 120 to the enclosure 114 by way of the openings 124. In certain embodiments, the power supply 108 is coupled to the screwless gas distributor assembly 104A, 104B to ionize the gas 120 so as to generate plasma in the enclosure 114. In various embodiments, a wafer 126 may be disposed on the screwless chuck assembly 106A, 106B. As noted above, the screwless gas distributor assembly 104A, 104B may be disposed over the screwless chuck assembly 106A, 106B.

In certain embodiments, the openings 124 are uniformly distributed on the screwless gas distributor assembly 104A, 104B in concentric rings spaced various distances from a center point. The dimensions and number of the openings 124 may determine the amount of gas distribution within the enclosure 114. For example, if a high gas amount at the edge of the screwless gas distributor assembly 104A, 104B is desired, more or larger openings 124 may be configured at the edge of the screwless gas distributor assembly 104A, 104B. In contrast, if a high gas amount at the center of the screwless gas distributor assembly 104A, 104B is desired, more or larger openings 124 may be configured at the center of the screwless gas distributor assembly 104A, 104B.

The screwless semiconductor processing chamber 102 may be an etch apparatus, chemical vapor deposition (CVD) chamber, physical vapor deposition (PVD) chamber, atomic layer deposition (ALD) chamber, remote plasma enhanced chemical vapor deposition (RPECVD) chamber, liquid source misted chemical deposition (LSMCD) chamber, furnace chamber, single wafer furnace chamber or other chamber in which chemicals, gas or plasma is provided via the screwless gas distributor assembly 104A, 104B.

The wafer 126 may be, for example, a silicon substrate, a III-V compound substrate, a glass substrate, a liquid crystal display (LCD) substrate, a printed circuit board (PCB) or any other substrate similar thereto. In some embodiments, the wafer 126 can be a blank substrate or comprise a variety of integrated devices or circuits, or layers for forming such, (not shown) thereon, for example.

The conduit 112 may be adapted to deliver the gas 120 to the screwless gas distributor assembly 104A, 104B for introduction into the enclosure 114 by way of the openings 124. The screwless chuck assembly 106A, 106B may be adapted to accommodate and hold the wafer 126. For example, the screwless chuck assembly 106A, 106B may comprise an electrostatic chuck, vacuum system, clamp or other apparatus that is able to keep the wafer 126 substantially on the screwless chuck assembly 106A, 106B. In some embodiments, a conduit 130 connected to an exhaust pump may exhaust gases or plasmas from the enclosure 114.

The gas 120 can be, for example, a pure chemical gas, a mixed chemical gas, a mist or moisture of chemical, an ionized gas, liquid, or other type of chemical. The gas 120 may be provided in the enclosure 114 way of the openings 124.

The power supply 108 can be, for example, a radio frequency (RF) power supply or other power supply that is adapted to provide a high voltage sufficient to ionize the gas 120 provided from the conduit 260 and to generate plasma in the screwless semiconductor processing chamber 102. In some embodiments, the screwless semiconductor processing chamber 102 is a single wafer furnace apparatus. For such embodiments, the power supply 108 can be eliminated, because generation of plasma is not required. Accordingly, one skilled in the art is able to select, for example, the screwless chuck assembly 106A, 106B, the screwless gas distributor assembly 104A, 104B, the power supply 108, the conduit 112 and/or the supporter 110 to provide a desired screwless semiconductor processing chamber 102.

In some embodiments, the screwless chuck assembly 106A, 106B includes a first chuck portion 106A and a second chuck portion 106B. The first chuck portion 106A may be part of an electrostatic chuck configured to adhere the wafer 126 to the screwless chuck assembly 106A, 106B via electrostatic forces. The supporter 110 may be connected to and support the screwless chuck assembly 106A, 106B while a process is executed.

For example, the first chuck portion 106A may be connected to a first chuck portion power supply 127 (e.g., a direct current (DC) generator), and positive charges or negative charges are distributed on the first chuck portion 106A by the first chuck portion power supply 127. The electric charges on the first chuck portion 106A may induce an electrostatic field such that the wafer 126 is chucked or dechucked. The second chuck portion 106B may be a bottom electrode coupled to a second chuck portion power supply 128 so as to enhance plasma within the enclosure 114. Stated another way, the second chuck portion 106B may control the reaction speed of plasma when plasma is generated in the enclosure 114.

Accordingly, the wafer 126 is put on the first chuck portion 106A, and an electrostatic field is induced by supplying power to the first chuck portion 106A on the upper surface of the electrostatic chuck 25. Positive charges accumulate on the first chuck portion 106A connected to the first chuck portion power supply 127, and negative charges accumulate on the lower surface of the wafer 126 by plasma generated on an upper portion of the wafer 126, thereby inducing an electrostatic field between the wafer 126 and the first chuck portion 106A. When the upper surface of the first chuck portion 106A is completely in contact with the wafer 126, a clamping force is produced by the electrostatic field, and thus the wafer is chucked.

In certain embodiments, the first chuck portion 106A may include a first chuck portion convex protrusion 130A and the second chuck portion 106B may include a second chuck portion concave opening 130B. The first chuck portion convex protrusion 130A may be configured to enter (e.g., configured to engage) the second chuck portion concave opening 130B and sit flush against a surface of the second chuck portion concave opening 130B. Also, the first chuck portion convex protrusion 130A may orient the first chuck portion 106A so that the first chuck portion 106A does not move laterally (e.g., along a horizontal axis) relative to the second chuck portion 106B. In certain embodiments, the first chuck portion convex protrusion 130A may be along a center axis 132 (e.g., a rotational axis orthogonal to the horizontal axis) of both the first chuck portion 106A and the second chuck portion 106B. Also, the second chuck portion concave opening 130B may also be along the center axis 132 (e.g., the rotational axis orthogonal to the horizontal axis) of both the first chuck portion 106A and the second chuck portion 106B and the second chuck portion concave opening 130B.

In various embodiments, the first chuck portion 106A may include a first location pin concavity 140A and the second chuck portion 106B may include a second location pin concavity 140B. A location pin may 142 be configured to be disposed within the first location pin concavity 140A and the second location pin concavity 140B to secure the first chuck portion 106A to the second chuck portion 106B (e.g., to stop one of the first chuck portion 106A or the second chuck portion 106B from rotating relative to the other around the center axis 132).

In various embodiments, the screwless gas distributor assembly 104A, 104B may include a first gas distributor portion 104A and a second gas distributor portion 104B. The second gas distributor portion 104B may form a ring laterally around the first gas distributor portion 104A (e.g., to laterally surround the first gas distributor portion 104A). Also, the first gas distributor portion 104A may include a first gas distributor portion convex protrusion 150A and the second gas distributor portion 104B may include a second gas distributor portion concave opening 150B. The first gas distributor portion convex protrusion 150A may be configured to enter (e.g., configured to engage) the second gas distributor portion concave opening 150B and sit flush against a surface of the second gas distributor portion concave opening 150B. Also, the first gas distributor portion convex protrusion 150A may orient the first gas distributor portion 104A so that the first gas distributor portion 104A does not move laterally (e.g., along a horizontal axis orthogonal to the rotational axis) relative to the second gas distributor portion 104B.

In various embodiments, the first gas distributor portion convex protrusion 150A may be a tenon tongue and the second gas distributor portion concave opening 150B may be a mortise hole. For example, the second gas distributor portion 104B may form a ring around the first gas distributor portion 104A. Then, various tenon tongues, or first gas distributor portion convex protrusions 150A, extending radially from the first gas distributor portion 104A may be configured to interface with and enter various mortise holes, or second gas distributor portion concave opening 150B, of the second gas distributor portion 104B disposed radially around the first gas distributor portion 104A.

In particular embodiments, the second gas distributor portion 104B may be formed of multiple pieces that are welded or otherwise adhered together without the use of nails or screws. For example, each piece of the second gas distributor portion pieces may be injection molded with respective mortise holes, assembled with the first gas distributor portion 104A, and then welded together to assemble the first gas distributor portion 104A and the second gas distributor portion 104B of the screwless gas distributor assembly 104A, 104B.

Figure 2A:
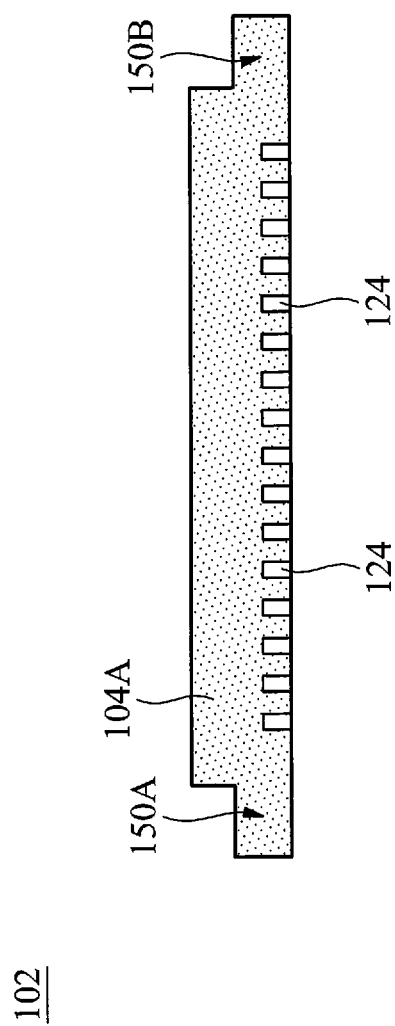
FIG. 2A is a side view illustration of the first gas distributor portion, in accordance with certain embodiments.

FIG. 2A is a side view illustration of the first gas distributor portion 104A, in accordance with certain embodiments. As illustrated, the first gas distributor portion 104A may include a first gas distributor portion convex protrusion 150A. The first gas distributor portion convex protrusion 150A may be configured to enter (e.g., configured to engage) the second gas distributor portion concave opening and sit flush against a surface of the second gas distributor portion concave opening.

As discussed above, in certain embodiments, the openings 124 may be uniformly distributed on the screwless gas distributor assembly 104A, 104B in concentric rings spaced various distances from a center pint. The dimensions and number of the openings 124 may determine the amount of gas distribution within the enclosure 114. For example, if a high gas amount at the edge of the screwless gas distributor assembly 104A, 104B is desired, more or larger openings 124 may be configured at the edge of the screwless gas distributor assembly 104A, 104B. In contrast, if a high gas amount at the center of the screwless gas distributor assembly 104A, 104B is desired, more or larger openings 124 may be configured at the center of the screwless gas distributor assembly 104A, 104B.

Figure 2B:
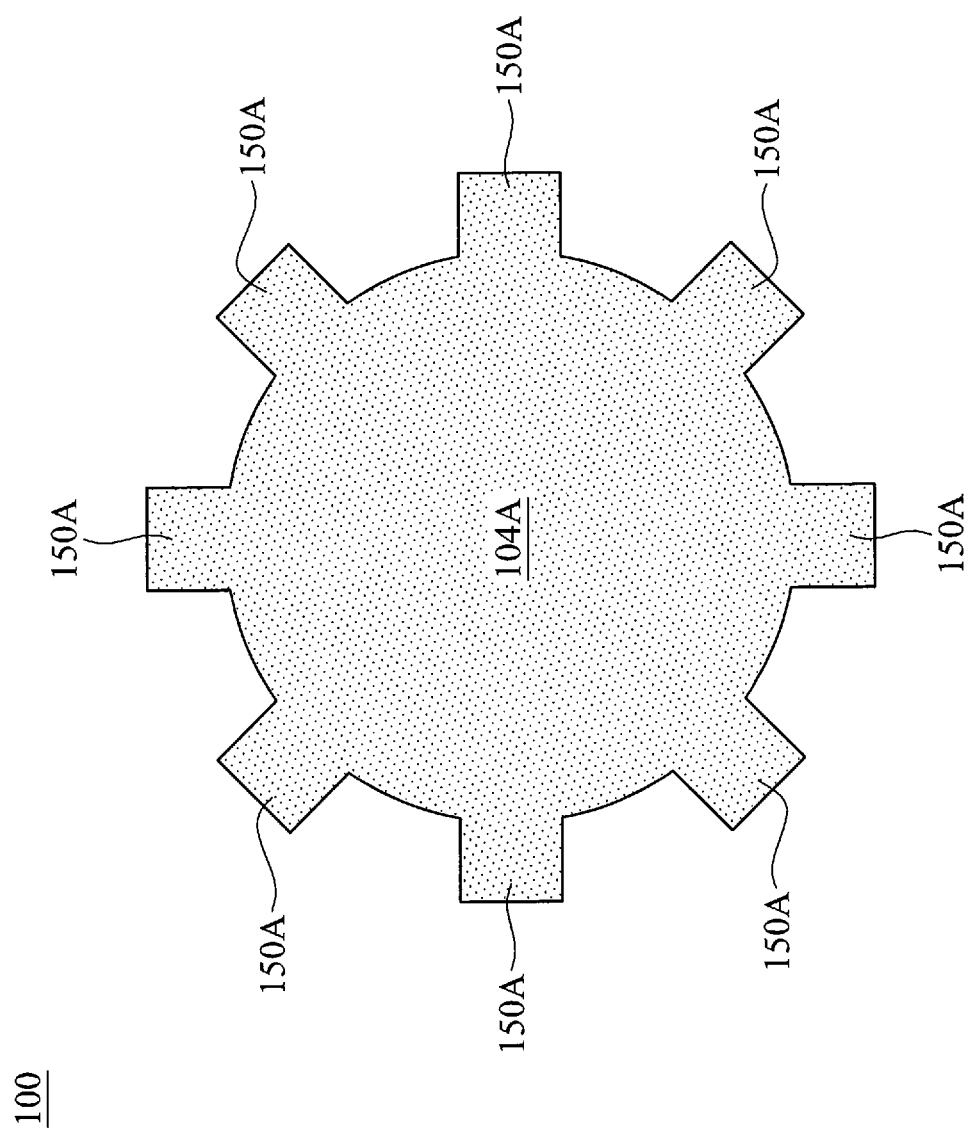
FIG. 2B is a plan view illustration of the first gas distributor portion, in accordance with certain embodiments.

FIG. 2B is a plan view illustration of the first gas distributor portion 104A, in accordance with certain embodiments. As illustrated, the first gas distributor portion 104A may include a first gas distributor portion convex protrusion 150A (e.g., a plurality of first gas distributor portion convex protrusions 150A). More specifically, each of the first gas distributor portion convex protrusions 150A may be configured to enter (e.g., configured to engage), and sit flush against a surface of, a respective one of the second gas distributor portion concave openings.

Figure 3A:
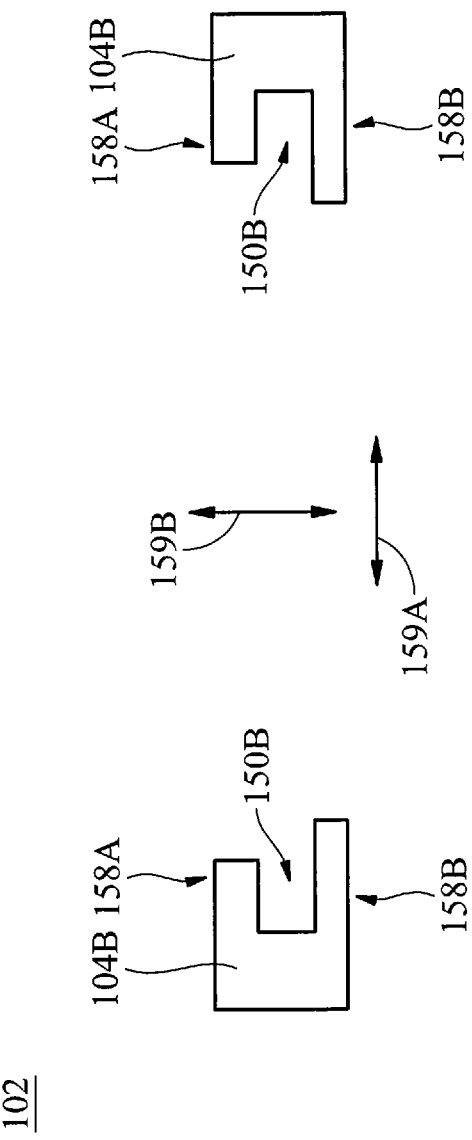
FIG. 3A is a side view illustration of the second gas distributor portion, in accordance with certain embodiments.

FIG. 3A is a side view illustration of the second gas distributor portion 104B, in accordance with certain embodiments. The second gas distributor portion 104B may form a ring laterally around the first gas distributor portion. Also, the second gas distributor portion 104B may include a second gas distributor portion concave opening 150B. The first gas distributor portion convex protrusion may be configured to enter (e.g., configured to engage) the second gas distributor portion concave opening 150B and sit flush against a surface of the second gas distributor portion concave opening 150B. Also, a top part 158A of the second gas distributor portion concave opening 150B may be shorter along a horizontal axis 159A and wider along a vertical axis 159B than a bottom part 158B of the second gas distributor portion concave opening 150B.

FIG. 3B is a plan view illustration of the second gas distributor portion 104B in a disassembled form, in accordance with certain embodiments. By being in a disassembled form, the second gas distributor portion 104B may be in separate pieces 160A, 160B, 160C, 160D. These separate pieces may be welded or otherwise adhered together without the use of nails or screws to assemble the second gas distributor portion 104B with the first gas distributor portion 104A. For example, each piece of the second portion pieces 160A, 160B, 160C, 160D may be injection molded with respective mortise holes, assembled with the first portion, and then welded together to fully assemble the first and second portions of the gas distributor assembly. In specific embodiments, the tenon tongue (e.g., convex protrusion) within the mortise hole (e.g., concave opening) may be flush with a surface of the mortise hole (e.g., concave opening).

As noted above, the second gas distributor portion 104B may form a ring laterally around the first gas distributor portion. Also, the second gas distributor portion 104B may include a second gas distributor portion concave opening 150B. The first gas distributor portion convex protrusion may be configured to enter (e.g., configured to engage) the second gas distributor portion concave opening 150B and sit flush against a surface of the second gas distributor portion concave opening 150B.

Figure 4:
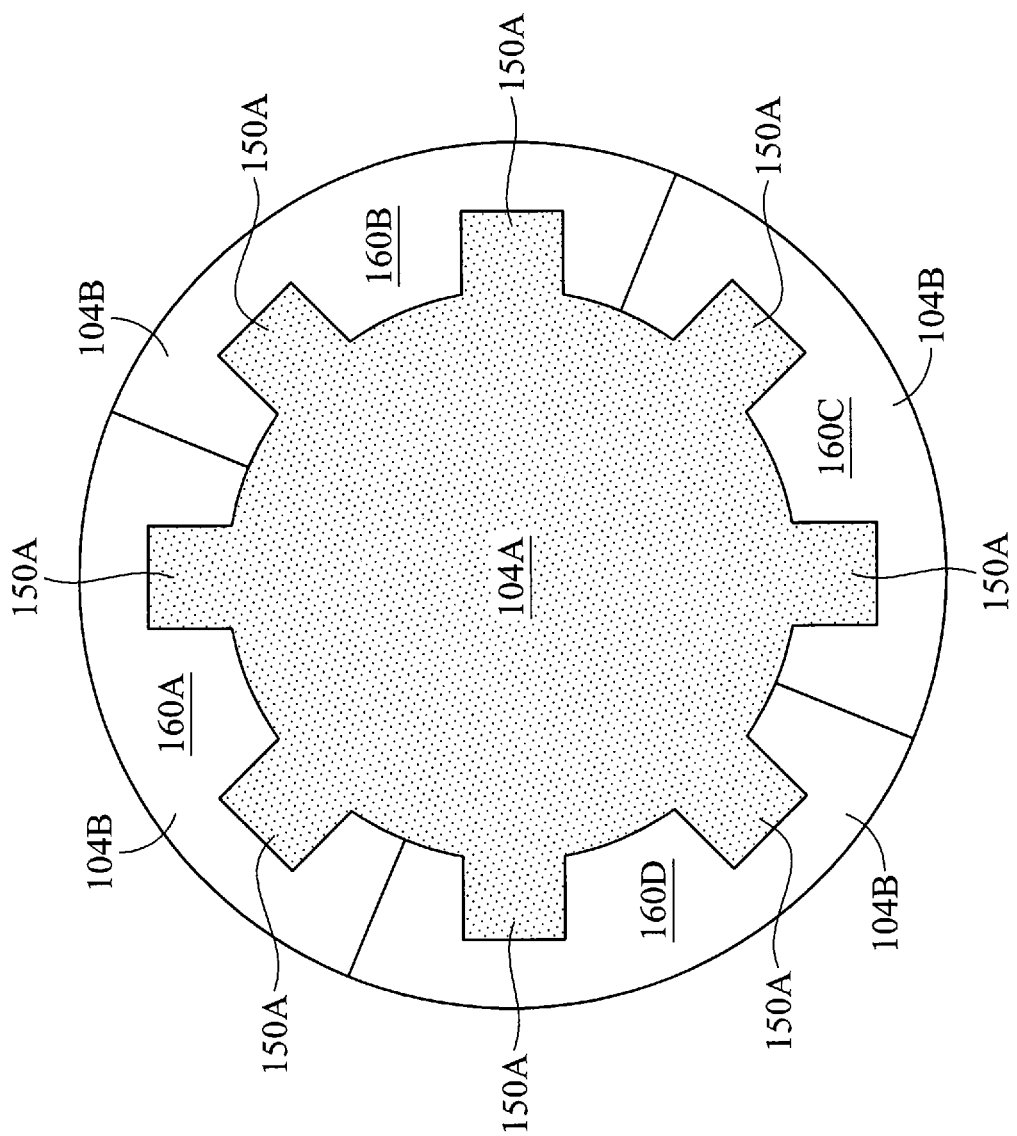
FIG. 4 is a plan sectional view illustration of the second gas distributor portion assembled with the first gas distributor portion, in accordance with certain embodiments.

FIG. 4 is a plan sectional view illustration of the second gas distributor portion 104B assembled with the first gas distributor portion 104A, in accordance with certain embodiments. By being in an assembled form, the separate pieces 160A, 160B, 160C, 160D of the second gas distributor portion 104B may be welded or otherwise adhered together without the use of nails or screws to fully assemble the second gas distributor portion 104B with the first gas distributor portion 104A. For example, each piece of the second portion pieces may be injection molded with respective mortise holes, assembled with the first portion, and then welded together to fully assemble the first and second portions of the gas distributor assembly. As noted above, the second gas distributor portion 104B may form a ring laterally around the first gas distributor portion. Also, the second gas distributor portion 104B may include a second gas distributor portion concave opening.

Figure 5A:
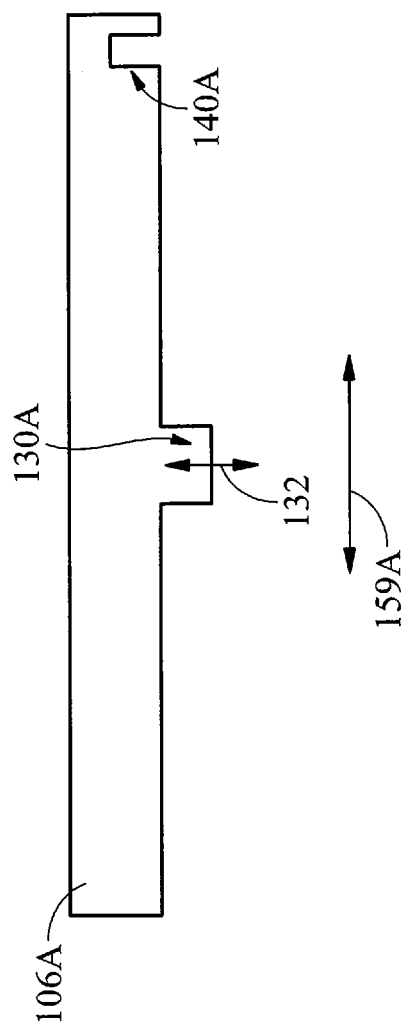
FIG. 5A is a side view of the first chuck portion, in accordance with some embodiments.

FIG. 5A is a side view of the first chuck portion 106A, in accordance with some embodiments. The first chuck portion 106A may include a first chuck portion convex protrusion 130A. The first chuck portion convex protrusion 130A may be configured to enter (e.g., configured to engage) the second chuck portion concave opening and sit flush against a surface of the second chuck portion concave opening. Also, the first chuck portion convex protrusion 130A may orient the first chuck portion 106A so that the first chuck portion 106A does not move laterally (e.g., along the horizontal axis 159A) relative to the second chuck portion. In certain embodiments, the first chuck portion convex protrusion 130A may be along the center axis 132 (e.g., a rotational axis orthogonal to the horizontal axis 159A) of the first chuck portion 106A. Also, in various embodiments, the first chuck portion 106A may include a first location pin concavity 140A.

Figure 5B:
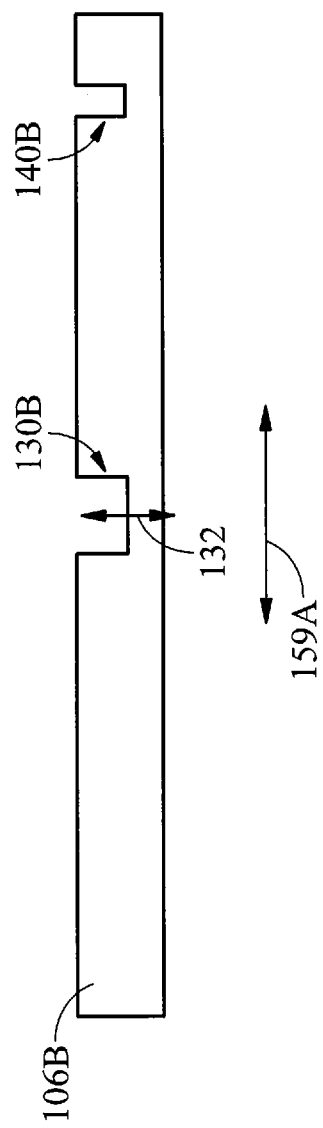
FIG. 5B is a side view of the second chuck portion, in accordance with some embodiments.

FIG. 5B is a side view of the second chuck portion 106B, in accordance with some embodiments. The second chuck portion 106B may include a second chuck portion concave opening 130B. The first chuck portion convex protrusion may be configured to enter (e.g., configured to engage) the second chuck portion concave opening 130B and sit flush against a surface of the second chuck portion concave opening 130B. In certain embodiments, the second chuck portion concave opening 130B may also be along the center axis 132 (e.g., the rotational axis orthogonal to the horizontal axis 159A) of the second chuck portion 106B and the second chuck portion concave opening 130B. In various embodiments, the second chuck portion 106B may include a second location pin concavity 140B.

Figure 6A:
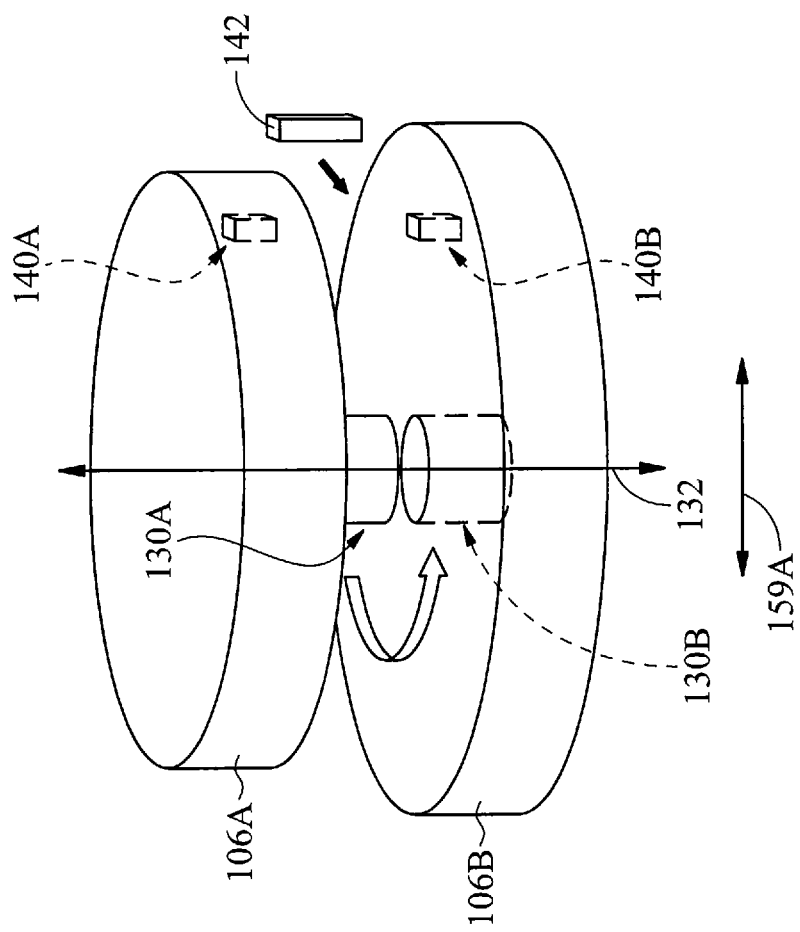
FIG. 6A is a perspective view of the first chuck portion and the second chuck portion in a disassembled form, in accordance with some embodiments.

FIG. 6A is a perspective view of the first chuck portion 106A and the second chuck portion 106B in a disassembled form, in accordance with some embodiments. By being in a disassembled form, the first chuck portion 106A may not be touching and may be separated from the second chuck portion 106B. As noted above, the first chuck portion 106A may include a first chuck portion convex protrusion 130A and the second chuck portion 106B may include a second chuck portion concave opening 130B. The first chuck portion convex protrusion 130A may be configured to enter (e.g., configured to engage) the second chuck portion concave opening 130B and sit flush against a surface of the second chuck portion concave opening 130B. Also, the first chuck portion convex protrusion 130A may orient the first chuck portion 106A so that the first chuck portion 106A does not move laterally (e.g., along a horizontal axis) relative to the second chuck portion 106B. In certain embodiments, the first chuck portion convex protrusion 130A may be along the center axis 132 (e.g., the rotational axis orthogonal to the horizontal axis) of both the first chuck portion 106A and the second chuck portion 106B. Also, the second chuck portion concave opening 130B may also be along the center axis 132 (e.g., the rotational axis orthogonal to the horizontal axis 159A) of both the first chuck portion 106A and the second chuck portion 106B and the second chuck portion concave opening 130B.

In various embodiments, the first chuck portion 106A may include a first location pin concavity 140A and the second chuck portion 106B may include a second location pin concavity 140B. A location pin may 142 be configured to be disposed within the first location pin concavity 140A and the second location pin concavity 140B to secure the first chuck portion 106A to the second chuck portion 106B (e.g., to stop one of the first chuck portion 106A or the second chuck portion 106B from rotating relative to the other around the center axis 132).

Figure 6B:
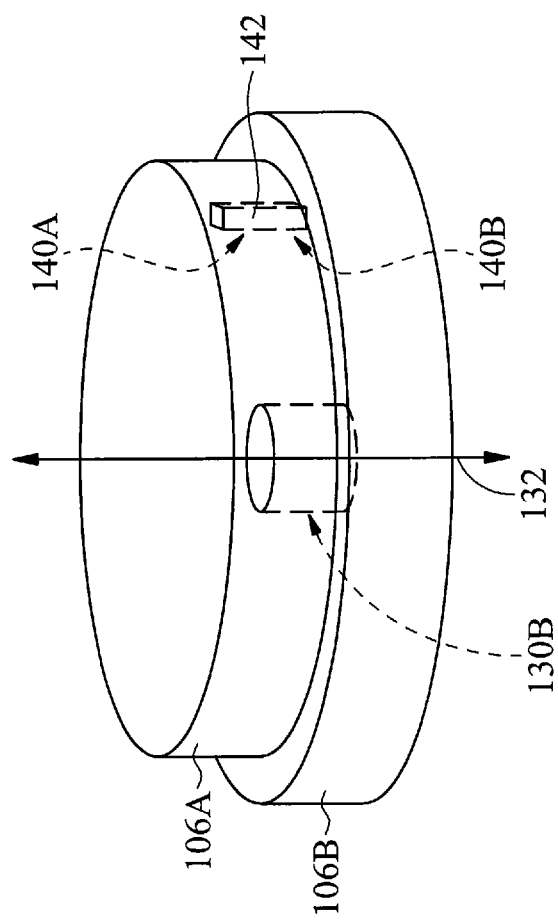
FIG. 6B is a perspective view of the first chuck portion and the second chuck portion in an assembled form, in accordance with some embodiments.

FIG. 6B is a perspective view of the first chuck portion 106A and the second chuck portion 106B in an assembled form, in accordance with some embodiments. By being in the assembled form, the first chuck portion 106A may touch and sit on the second chuck portion 106B. Also, the first chuck portion convex protrusion 130A may be within the second chuck portion concave opening 130B and sit flush against a surface of the second chuck portion concave opening 130B. Additionally, the location pin may 142 be configured to be disposed within the first location pin concavity 140A and the second location pin concavity 140B to secure the first chuck portion 106A to the second chuck portion 106B (e.g., to stop one of the first chuck portion 106A or the second chuck portion 106B from rotating relative to the other around the center axis 132).

Figure 7:
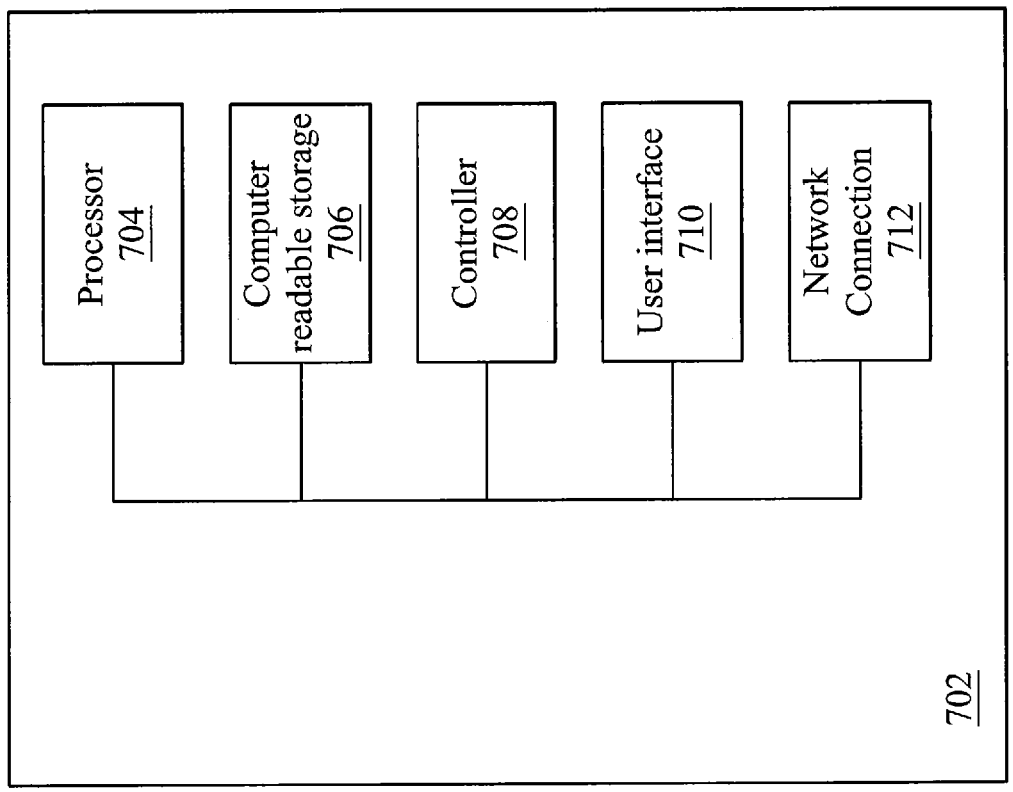
FIG. 7 is a block diagram of a screwless semiconductor chamber functional module of a screwless semiconductor chamber, in accordance with some embodiments.

FIG. 7 is a block diagram of a screwless semiconductor chamber functional module of 702 a screwless semiconductor chamber, in accordance with some embodiments. The screwless semiconductor chamber functional module may include a processor 704. In further embodiments, the processor 704 may be implemented as one or more processors.

The processor 704 may be operatively connected to a computer readable storage module 706 (e.g., a memory and/or data store), a controller module 708 (e.g., a controller), a user interface module 710 (e.g., a user interface), and a network connection module 712 (e.g., network interface). In some embodiments, the computer readable storage module 706 may include screwless semiconductor chamber logic that may configure the processor 704 to perform various processes discussed herein. The computer readable storage may also store data, such as identifiers for a wafer, identifiers for a screwless semiconductor chamber, identifiers for particular gas or plasma, and any other parameter or information that may be utilized to perform the various processes discussed herein.

The screwless semiconductor chamber functional module 702 may include a controller module 708. The controller module 708 may be configured to control various physical apparatuses that control movement or functionality for a supporter, screwless gas distributor assembly, screwless chuck assembly, and the like. For example, the controller module 708 may be configured to control movement or functionality for at least one of a robotic arm that moves the wafer, an actuator for the supporter of the screwless chuck assembly, and the like. For example, the controller module 708 may control a motor or actuator that may move or activate at least one of a robotic arm (discussed further below), and/or supporter. The controller may be controlled by the processor and may carry out aspects of the various processes discussed herein.

The screwless semiconductor chamber functional module 702 may also include the user interface module 710. The user interface module may include any type of interface for input and/or output to an operator of the screwless semiconductor chamber functional module 702, including, but not limited to, a monitor, a laptop computer, a tablet, or a mobile device, etc.

The network connection module 712 may facilitate a network connection of the screwless semiconductor chamber functional module 702 with various devices and/or components of the screwless semiconductor chamber functional module 702 that may communicate (e.g., send signals, messages, instructions, or data) within or external to the screwless semiconductor chamber functional module 702. In certain embodiments, the network connection module 712 may facilitate a physical connection, such as a line or a bus. In other embodiments, the network connection module 712 may facilitate a wireless connection, such as over a wireless local area network (WLAN) by using a transmitter, receiver, and/or transceiver. For example, the network connection module 712 may facilitate a wireless or wired connection with the sensor 714, the processor 704, the computer readable storage 706, and the controller 708.

Figure 8:
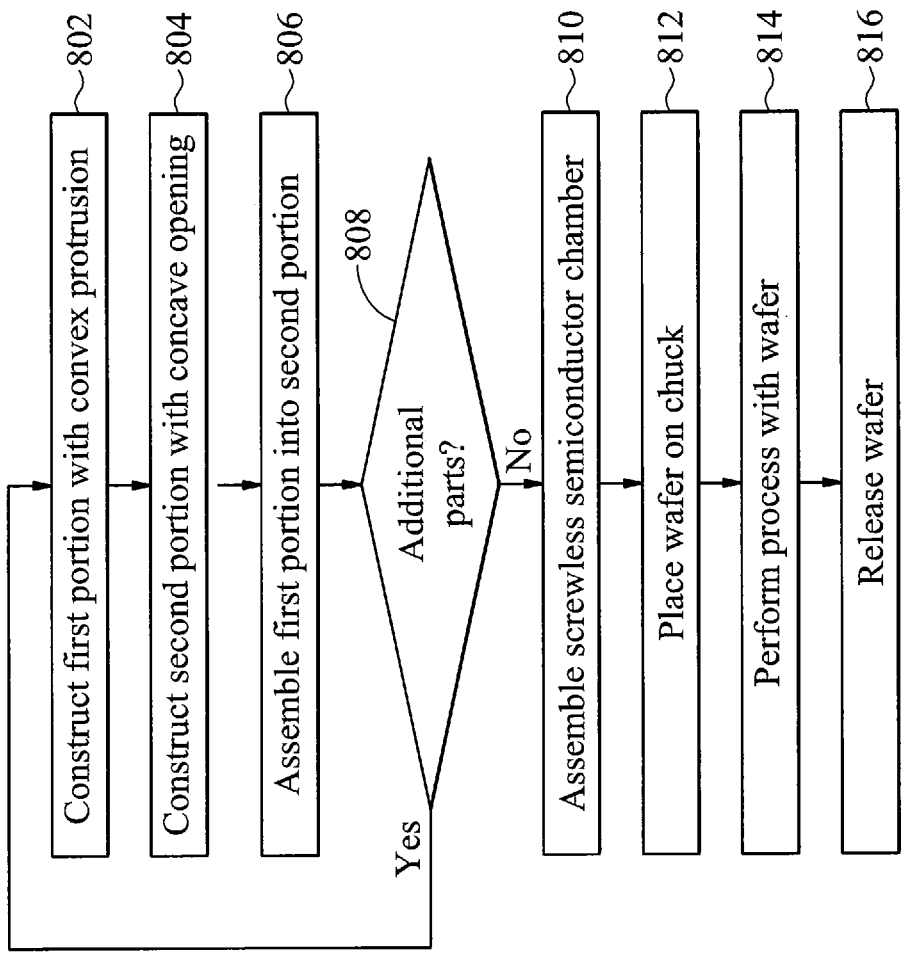
FIG. 8 is a flow chart of a screwless semiconductor chamber process, in accordance with some embodiments.

FIG. 8 is a flow chart of a screwless semiconductor chamber process 800, in accordance with some embodiments. The screwless semiconductor chamber process 800, may be performed using components of a screwless semiconductor chamber, as introduced above. It is noted that the process 800 is merely an example, and is not intended to limit the present disclosure. Accordingly, it is understood that additional operations may be provided before, during, and after the process 800 of FIG. 8, certain operations may be omitted, certain operations may be performed concurrently with other operations, and that some other operations may only be briefly described herein.

At operation 802, a first portion with a convex protrusion may be constructed or provided. As noted above, the first portion may be of, for example, any of a screwless gas distributor assembly or a screwless chuck assembly. For example, the first portion may be constructed using conventional injection molding techniques or assembled from smaller constituent pieces to form the first portion.

At operation 804, a second portion with a concave opening may be constructed or provided. As noted above, the second portion may be of, for example, any of the screwless gas distributor assembly or the screwless chuck assembly of operation 802. For example, the second portion may be constructed using conventional injection molding techniques or assembled from smaller constituent pieces to form the second portion.

At operation 806, the screwless gas distributor assembly or the screwless chuck assembly may be assembled by connecting (e.g., placing) the convex protrusion into the concave opening. This assembly may include moving the first portion and second portion together such that different structural features of the first portion and second portion interlock.

In particular embodiments, other implements may also be included in the assembly of the first portion and the second portion, such as a location pin connected or inserted into a respective first location pin concavity on the first portion and a second location pin concavity on the second portion. As noted above, the location pin may be configured to be disposed within the first location pin concavity and the second location pin concavity to secure, for example, a first portion that is a first chuck portion to a second portion that is a second chuck portion (e.g., to stop one of the first chuck portion or the second chuck portion from rotating relative to the other around a center axis).

At operation 808, a decision may be made as to whether additional screwless parts of a screwless semiconductor chamber are to be assembled. If there are additional screwless parts to be assembled (e.g., a screwless gas distributor assembly or a screwless chuck assembly), then the process 800 returns to operation 802. However, if there are no additional screwless parts to be assembled, then the process 800 proceeds to operation 810.

At operation 810, the screwless semiconductor chamber may be assembled. As noted above, the screwless semiconductor chamber may include at least one of a screwless gas distributor assembly and a screwless chuck assembly. Accordingly, once the desired one or both of the screwless gas distributor assembly and the screwless chuck assembly is constructed or provided, then the rest of the screwless semiconductor chamber may be assembled and prepared for operation.

At operation 812, a wafer may be placed on the screwless chuck assembly. More specifically, the wafer may be placed on the a screwless chuck assembly within a screwless semiconductor chamber. The wafer may be placed on the screwless chuck assembly via a robotic arm that may move into and out of the enclosure of the screwless semiconductor chamber via a portal. The portal may be any region of the screwless semiconductor chamber configured to be opened and/or closed as desired to provide access to the enclosure region of the screwless semiconductor chamber.

At operation 814, a process may be performed on the wafer within the screwless semiconductor chamber. The process may be, for example, an etch process, a chemical vapor deposition (CVD) process, a physical vapor deposition (PVD) process, an atomic layer deposition (ALD) process, a remote plasma enhanced chemical vapor deposition (RPECVD) process, a liquid source misted chemical deposition (LSMCD) process, and/or any other process in which a chemical, gas or plasma is provided via the screwless gas distributor assembly.

At operation 816, the wafer may be released upon the end of the process. For example, the wafer may be released by releasing the electrostatic force that adheres the wafer to the screwless chuck assembly. Thus, the freed wafer may be removed from the screwless semiconductor chamber by a robotic arm that may move into and out of the enclosure of the screwless semiconductor chamber via the portal.

In an embodiment, a system includes: a gas distributor assembly configured to dispense gas into a chamber; and a chuck assembly configured to secure a wafer within the chamber, wherein at least one of the gas distributor assembly and the chuck assembly includes: a first portion comprising a convex protrusion, and a second portion comprising a concave opening, wherein the convex protrusion is configured to engage the concave opening.

In another embodiment, a system includes: a gas distributor assembly configured to dispense gas into a chamber, wherein the gas distributor assembly includes: a first gas distributor portion comprising a convex protrusion, and a second gas distributor portion comprising a concave opening, wherein the convex protrusion is configured to engage the concave opening; and a chuck assembly configured to secure a wafer within the chamber, wherein the chuck assembly is underneath the gas distributor assembly.

In another embodiment, a method includes: constructing a first portion comprising a convex protrusion, constructing a second portion comprising a concave opening, wherein the first portion and the second portion are part of either: a gas distributor assembly configured to dispense gas into a chamber, or a chuck assembly configured to secure a wafer within the chamber; and placing the convex protrusion within the concave opening.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a gas distributor assembly configured to dispense gas into a chamber;
a chuck assembly configured to secure a wafer within the chamber, wherein the chuck assembly comprises:
a first portion comprising a convex protrusion, and
a second portion comprising a concave opening, wherein the convex protrusion is configured to engage the concave opening;
a first power supply coupled to the first portion and configured to induce an electrostatic field between the wafer and the first portion; and
a second power supply coupled to the second portion and configured to control reaction speed of a plasma when the plasma is generated in the chamber.

2. The system of claim 1, wherein the convex protrusion is a tenon tongue and the concave opening is a mortise hole.

3. The system of claim 1, wherein the convex protrusion protrudes from a center of the first portion.

4. The system of claim 1, wherein the first portion comprises a first location pin concavity and the second portion comprises a second location pin concavity, wherein a location pin is configured to be disposed within the first location pin concavity and the second location pin concavity.

5. The system of claim 1, wherein the gas distributor assembly comprises the first portion and the second portion.

6. The system of claim 1, wherein both the gas distributor assembly and the chuck assembly comprise a respective set of the first portion and the second portion.

7. The system of claim 1, wherein the first portion is part of an electrostatic chuck configured to adhere the wafer via electrostatic forces.

8. The system of claim 1, wherein the first portion is disposed on the second portion.

9. A system, comprising:
a gas distributor assembly configured to dispense gas into a chamber, wherein the gas distributor assembly comprises:
a first gas distributor portion comprising a first convex protrusion, and
a second gas distributor portion comprising a first concave opening, wherein the convex protrusion is configured to engage the concave opening;
a chuck assembly configured to secure a wafer within the chamber, wherein the chuck assembly is underneath the gas distributor assembly, wherein the chuck assembly comprises:
a first portion configured to hold a wafer thereon, the first portion comprising a second convex protrusion, and
a second portion disposed under the first portion, the second portion comprising a second concave opening, wherein the second convex protrusion is configured to engage the second concave opening;
a first power supply coupled to the first portion and configured to induce an electrostatic field between the wafer and the first portion; and
a second power supply coupled to the second portion and configured to control reaction speed of a plasma when the plasma is generated in the chamber.

10. The system of claim 9, wherein the second gas distributor portion forms a ring that surround the first gas distributor portion.

11. The system of claim 9, wherein the first gas distributor portion comprises multiple convex protrusions and the second gas distributor portion comprises multiple concave openings, wherein each of the multiple convex protrusions are configured to engage a respective one of the concave openings.

12. The system of claim 9, wherein the second gas distributor portion is formed of multiple pieces welded together.

13. The system of claim 9, wherein the first convex protrusion within the first concave opening is flush with a surface of the first concave opening.

14. The system of claim 9, wherein the first gas distributor portion and the second gas distributor portion are formed by an injection mold.

15. The system of claim 9, wherein the first convex protrusion protrudes radially from the first gas distributor portion.

16. A system, comprising:
a gas distributor assembly configured to dispense gas into a chamber, wherein the gas distributor assembly comprises:
a first gas distributor portion comprising a convex protrusion, and
a second gas distributor portion comprising a concave opening, wherein the convex protrusion is configured to engage the concave opening;
a chuck assembly configured to secure a wafer within the chamber, wherein the chuck assembly comprised comprises:
a first portion comprising a convex protrusion, and
a second portion comprising a concave opening, wherein the convex protrusion is configured to engage the concave opening;
a first power supply coupled to the first portion and configured to induce an electrostatic field between the wafer and the first portion; and
a second power supply coupled to the second portion and configured to control reaction speed of a plasma when the plasma is generated in the chamber.

17. The system of claim 16, wherein the second gas distributor portion forms a ring that surround the first gas distributor portion.

18. The system of claim 16, wherein the first gas distributor portion comprises multiple convex protrusions and the second gas distributor portion comprises multiple concave openings, wherein each of the multiple convex protrusions are configured to engage a respective one of the concave openings.

19. The system of claim 16, wherein the second gas distributor portion is formed of multiple pieces welded together.

20. The system of claim 16, wherein the convex protrusion within the concave opening is flush with a surface of the concave opening.

* * * * *